(12) United States Patent
Iimori (10) Patent No.: US 11,508,574 B2
(45) Date of Patent: Nov. 22, 2022

(54) SEMICONDUCTOR MANUFACTURING APPARATUS AND MANUFACTURING METHOD OF SEMICONDUCTOR DEVICE

(71) Applicant: Kioxia Corporation, Minato-ku (JP)

(72) Inventor: Hiroyasu Iimori, Nagoya (JP)

(73) Assignee: Kioxia Corporation, Minato-ku (JP)

(*) Notice: Subject to any disclaimer, the term of this patent is extended or adjusted under 35 U.S.C. 154(b) by 144 days.

(21) Appl. No.: 16/811,241

(22) Filed: Mar. 6, 2020

(65) Prior Publication Data
US 2021/0066076 A1 Mar. 4, 2021

(30) Foreign Application Priority Data

Aug. 30, 2019 (JP) .............................. JP2019-158135

(51) Int. Cl.
*H01L 21/67* (2006.01)
*H01L 21/02* (2006.01)

(52) U.S. Cl.
CPC .. *H01L 21/02282* (2013.01); *H01L 21/67051* (2013.01)

(58) Field of Classification Search
CPC ......... H01L 21/02282; H01L 21/67051; H01L 21/6708; H01L 21/67253; H01L 21/67288; H01L 22/12; H01L 21/67259; H01L 22/26; G01B 11/026; G01B 11/16
See application file for complete search history.

(56) References Cited

U.S. PATENT DOCUMENTS

| | | | |
|---|---|---|---|
| 6,401,359 B1 | 6/2002 | Amano | |
| 7,154,611 B2 | 12/2006 | Kim | |
| 8,801,891 B2 | 8/2014 | Tsuruda | |
| 9,623,516 B2 | 4/2017 | Kondo | |
| 9,627,238 B2 | 4/2017 | Morikawa et al. | |
| 2004/0235308 A1* | 11/2004 | Sato | H01L 21/67051 438/704 |
| 2007/0169793 A1* | 7/2007 | Shimada | H01L 21/67023 134/26 |
| 2008/0293253 A1* | 11/2008 | Itzkowitz | H01L 21/6708 438/745 |

FOREIGN PATENT DOCUMENTS

| | | | | |
|---|---|---|---|---|
| JP | 59-22330 A | 2/1984 | | |
| JP | 2003332299 A | * 11/2003 | ......... | G01B 11/0625 |
| JP | 2006-13089 A | 1/2006 | | |
| JP | 2012-248695 A | 12/2012 | | |

(Continued)

*Primary Examiner* — Jarrett J Stark
(74) *Attorney, Agent, or Firm* — Oblon, McClelland, Maier & Neustadt, L.L.P.

(57) ABSTRACT

A semiconductor manufacturing apparatus according to an embodiment includes: a stage to have a plurality of pins to hold a semiconductor substrate having a first surface on which a film to be etched is formed and a second surface positioned on an opposite side to the first surface; a nozzle to eject a liquid chemical toward the first surface of the semiconductor substrate from above the stage; and an optical measurer to radiate light toward the second surface of the semiconductor substrate from a side of the stage during ejection of the liquid chemical, and to measure a displacement amount of the semiconductor substrate based on a state of reception of light reflected on the second surface.

4 Claims, 12 Drawing Sheets

(56) References Cited

FOREIGN PATENT DOCUMENTS

| JP | 2017-85174 A | 5/2017 |
|---|---|---|
| TW | 419744 B | 1/2001 |
| TW | 200306623 A | 11/2003 |
| TW | I545672 B | 8/2016 |
| TW | I665722 B | 7/2019 |

* cited by examiner

SEMICONDUCTOR MANUFACTURING APPARATUS AND MANUFACTURING METHOD OF SEMICONDUCTOR DEVICE

CROSS-REFERENCE TO RELATED APPLICATIONS

This application is based upon and claims the benefit of priority from Japanese Patent Application No. 2019-158135, filed on Aug. 30, 2019; the entire contents of which are incorporated herein by reference.

FIELD

Embodiments of the present invention relate to a semiconductor manufacturing apparatus and a manufacturing method of a semiconductor device.

BACKGROUND

Production steps of a semiconductor device include a step of etching a film formed on a semiconductor substrate. In the etching step, a method of detecting a state of progress of etching by optically measuring deformation of the semiconductor substrate is known.

DETAILED DESCRIPTION

Embodiments will now be explained with reference to the accompanying drawings. The present invention is not limited to the embodiments.

A semiconductor manufacturing apparatus according to an embodiment includes: a stage to have a plurality of pins to hold a semiconductor substrate having a first surface on which a film to be etched is formed and a second surface positioned on an opposite side to the first surface; a nozzle to eject a liquid chemical toward the first surface of the semiconductor substrate from above the stage; and an optical measurer to radiate light toward the second surface of the semiconductor substrate from a side of the stage during ejection of the liquid chemical, and to measure a displacement amount of the semiconductor substrate based on a state of reception of light reflected on the second surface.

First Embodiment

Figure 1:
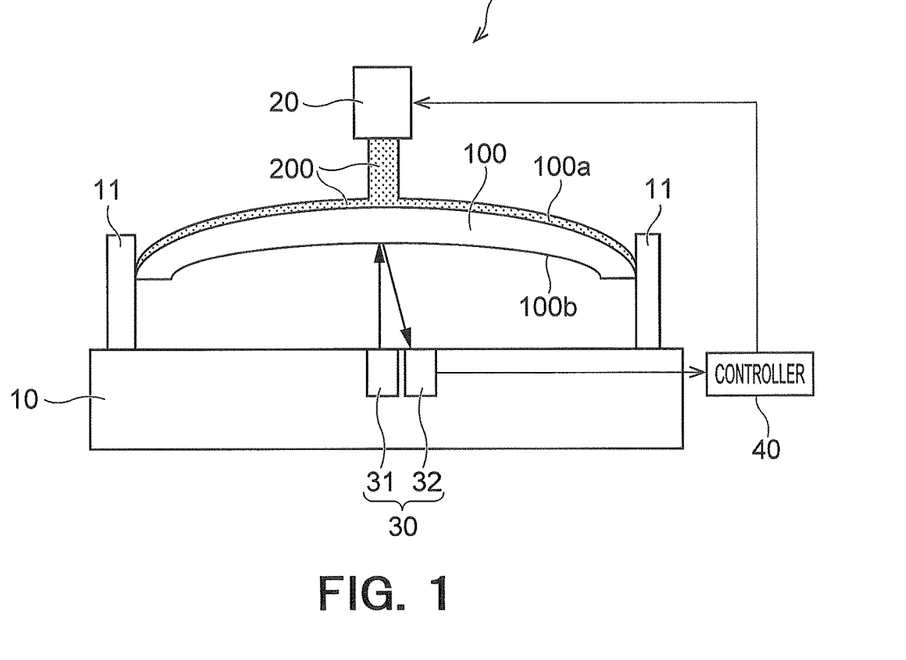
FIG. 1 is a schematic diagram showing an outline configuration of a semiconductor manufacturing apparatus according to a first embodiment.

FIG. 1 is a schematic diagram showing an outline configuration of a semiconductor manufacturing apparatus according to a first embodiment. A semiconductor manufacturing apparatus 1 shown in FIG. 1 is a single-wafer etching apparatus which processes semiconductor substrates 100 one by one. The semiconductor manufacturing apparatus 1 includes a stage 10, a nozzle 20, an optical measurer 30 and a controller 40.

Figure 2:
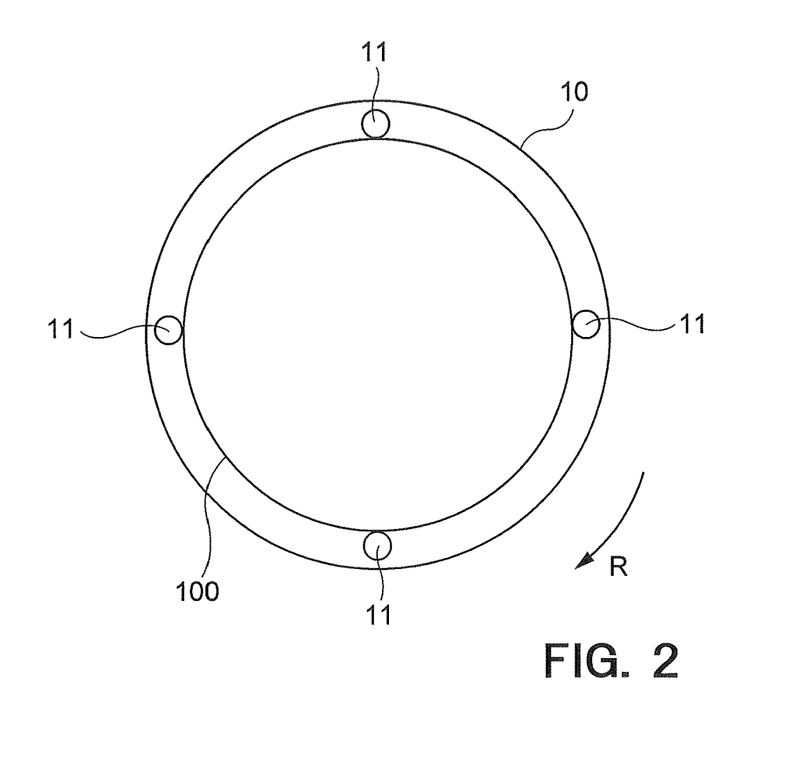
FIG. 2 is a plan view of a stage.

FIG. 2 is a plan view of the stage 10. The stage 10 is rotated in a rotational direction R based on control by the controller 40. Moreover, a plurality of pins 11 are installed on an upper surface of the stage 10.

As shown in FIG. 2, the plurality of pins 11 are dispersed in the rotational direction R of the stage 10, in other words, in a circumferential direction thereof at regular intervals. While FIG. 2 shows four pins 11, the number of pins 11 is not specially limited. Notches by way of example are formed in the plurality of pins 11. Each semiconductor substrate 100 is held by being fitted to the notches at an outer circumferential part of the semiconductor substrate 100

The semiconductor substrate 100 is a silicon substrate having a first surface 100a and a second surface 100b. A film to be etched is formed on the first surface 100a. The second surface 100b is positioned on an opposite side to the first surface. As shown in FIG. 1, the semiconductor substrate 100 is held with the plurality of pins 11 in a state where the first surface 100a is an upper surface.

The nozzle 20 ejects a liquid chemical 200 toward the first surface 100a of the semiconductor substrate 100 from above the stage 10 based on control by the controller 40. The liquid chemical 200 is etching liquid.

The optical measurer 30 has a light irradiator 31 and a light receiver 32. The light irradiator 31 and the light receiver 32 are embedded in the stage 10 inward of the plurality of pins 11. The light irradiator 31 radiates laser light toward the second surface 100b during etching of the film formed on the first surface 100a of the semiconductor substrate 100 based on control by the controller 40. To measure deformation of the semiconductor substrate 100 with high accuracy, the light irradiator 31 desirably radiates the laser light toward a center part of the second surface 100b. The light receiver 32 receives light reflected on the second surface 100b, and converts an optical signal obtained by receiving the light into an electric signal to output it to the controller 40.

The controller 40 is constituted of a CPU (Central Processing Unit) which operates, for example, based on a predetermined program. The controller 40 controls operations of the aforementioned units.

Hereafter, a manufacturing method of a semiconductor device using the aforementioned semiconductor manufacturing apparatus 1 is described. Herein, some of production steps of word lines in a three-dimensionally stacked semiconductor storage device are described.

Figure 3A:
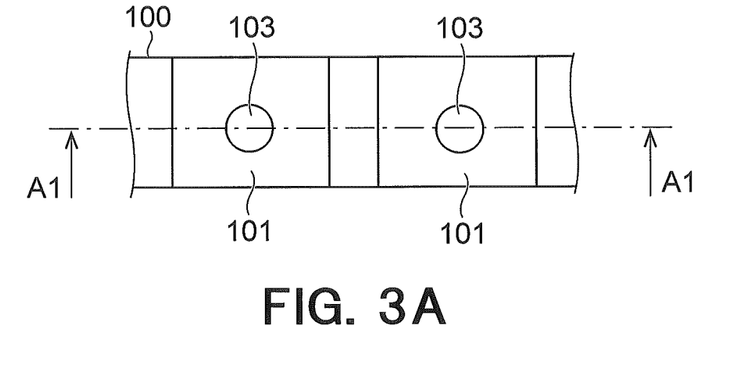
FIG. 3A is a plan view of a semiconductor device before etching sacrificial layers.
Figure 3B:
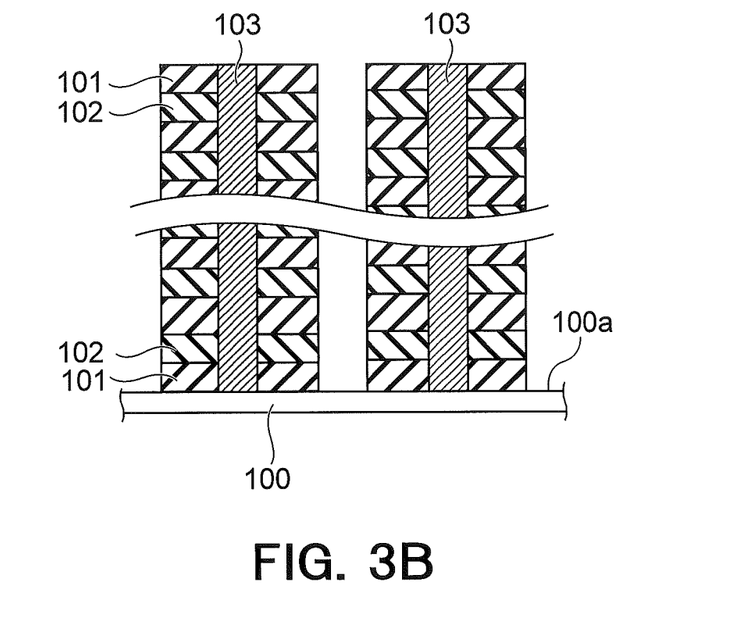
FIG. 3B is a cross sectional view taken along the sectional line A1-A1 shown in FIG. 3A.
Figure 4A:
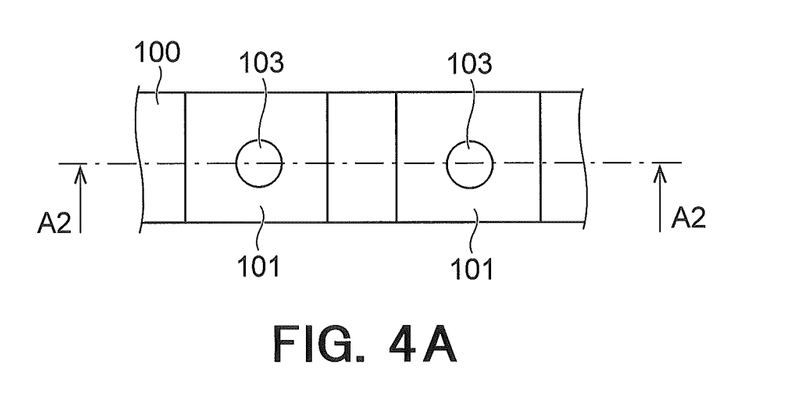
FIG. 4A is a plan view of the semiconductor device after etching the sacrificial layers.
Figure 4B:
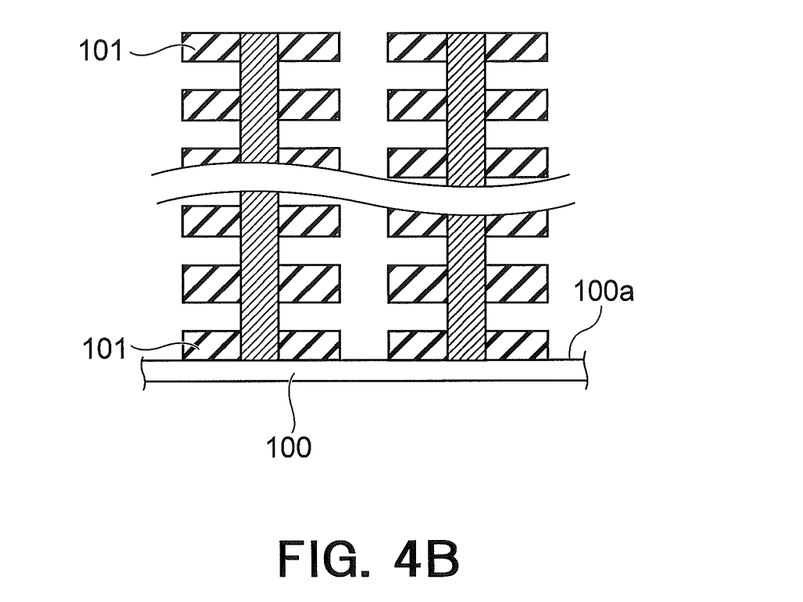
FIG. 4B is a cross sectional view taken along the sectional line A2-A2 shown in FIG. 4A.

FIG. 3A is a plan view of a semiconductor device before etching sacrificial layers. FIG. 3B is a cross sectional view taken along the sectional line A1-A1 shown in FIG. 3A. FIG. 4A is a plan view of the semiconductor device after etching the sacrificial layers. FIG. 4B is a cross sectional view taken along the sectional line A2-A2 shown in FIG. 4A.

As shown in FIG. 3B, insulating layers 101 and sacrificial layers 102 are alternately stacked on the first surface 100a of the semiconductor substrate 100. Moreover, columnar bodies 103 penetrate stacked bodies in each of which the insulating layers 101 and the sacrificial layers 102 are stacked. In the present embodiment, the insulating layers 101 and the columnar bodies 103 are silicon oxide ($SiO_2$) layers, and the sacrificial layers 102 are silicon nitride (SiN) layers.

After the semiconductor device shown in FIG. 3A and FIG. 3B is held by the pins 11, the nozzle 20 exemplarily ejects a phosphoric acid solution as the liquid chemical 200. As a result, as shown in FIG. 4B, the sacrificial layers 102 are etched. Moreover, as shown on the right side of FIG. 5, an amount of warping of the semiconductor substrate 100 changes, so that the second surface 100b is displaced.

Figure 5:
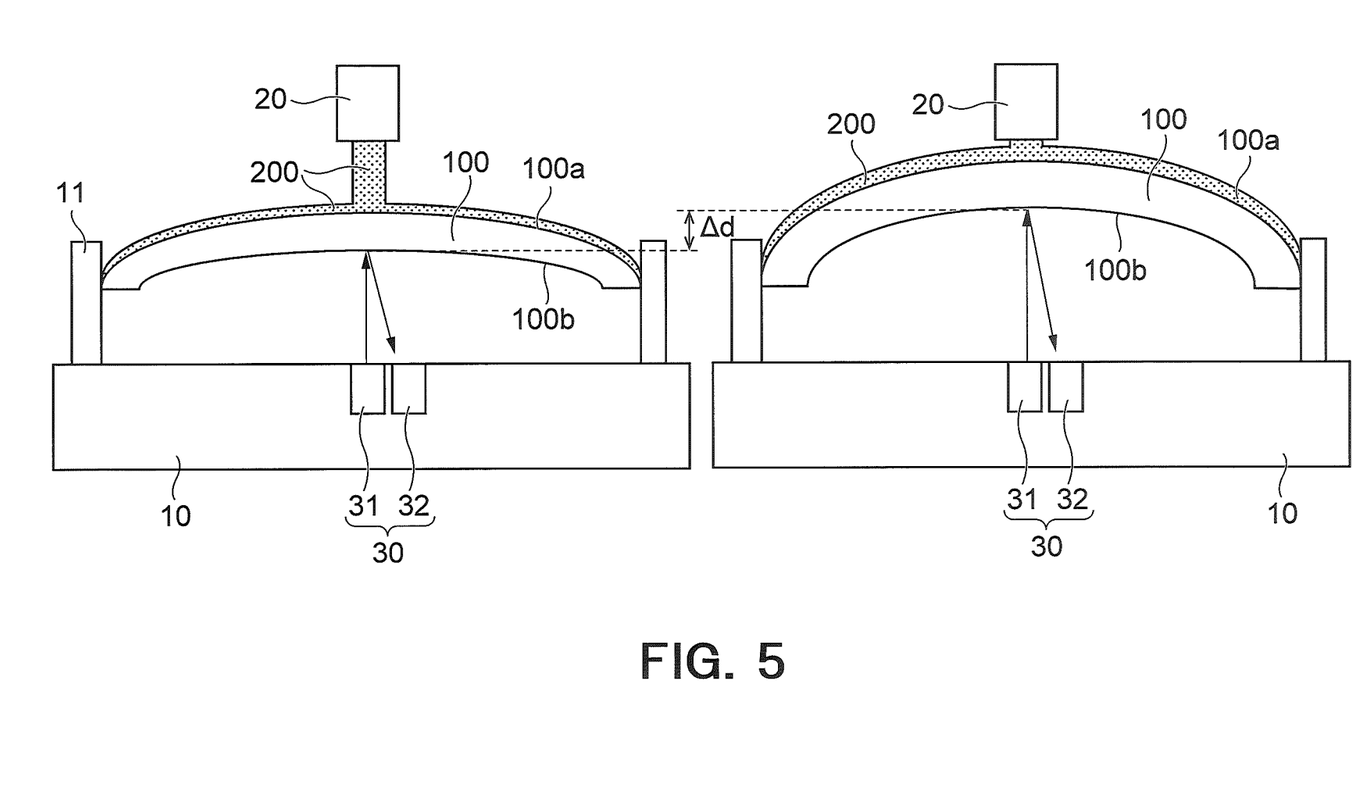
FIG. 5 is a schematic diagram for explaining a displacement amount Δd of a semiconductor substrate in etching of the sacrificial layers.
Figure 6:
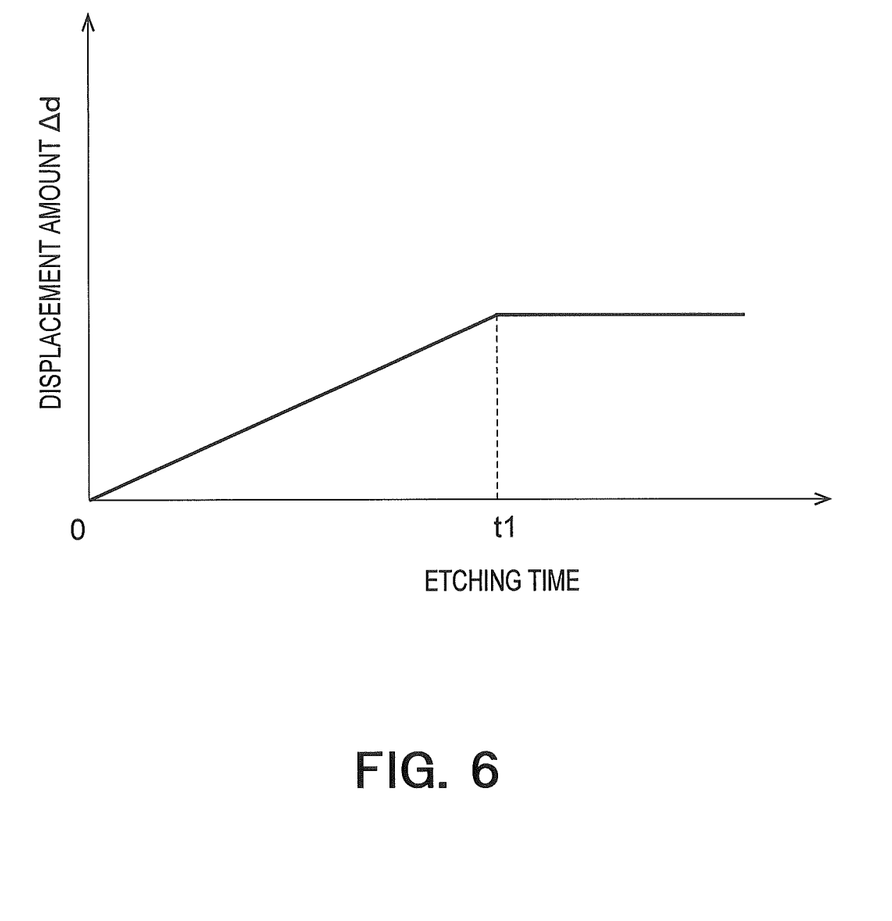
FIG. 6 is a graph showing relation between an etching time of the sacrificial layers and the displacement amount Δd of the semiconductor substrate.

FIG. 5 is a schematic diagram for explaining a displacement amount $\Delta d$ of the semiconductor substrate 100 in etching of the sacrificial layers 102. FIG. 6 is a graph showing relation between an etching time of the sacrificial layers 102 and the displacement amount $\Delta d$ of the semiconductor substrate 100.

The displacement amount $\Delta d$ of the second surface 100b is measured by the optical measurer 30. As shown in FIG. 5, as the amount of warping of the semiconductor substrate 100 increases more, a distance between the optical measurer 30 and the second surface 100b becomes longer. Therefore, a time required for the light receiver 32 receiving light from the light irradiator 31 also becomes longer. Therefore, the displacement amount $\Delta d$ of the semiconductor substrate 100 can be measured based on the light receiving time of the light receiver 32.

As shown in FIG. 6, the displacement amount $\Delta d$ continuously increases as etching of the sacrificial layers 102 progresses. Then, after the etching of the sacrificial layers 102 completes, the displacement amount $\Delta d$ is constant. The controller 40 causes the nozzle 20 to end the ejection of the liquid chemical 200, at timing t1 when the displacement amount $\Delta d$ becomes constant.

Next, steps after the etching of the sacrificial layers 102 are described.

Figure 7A:
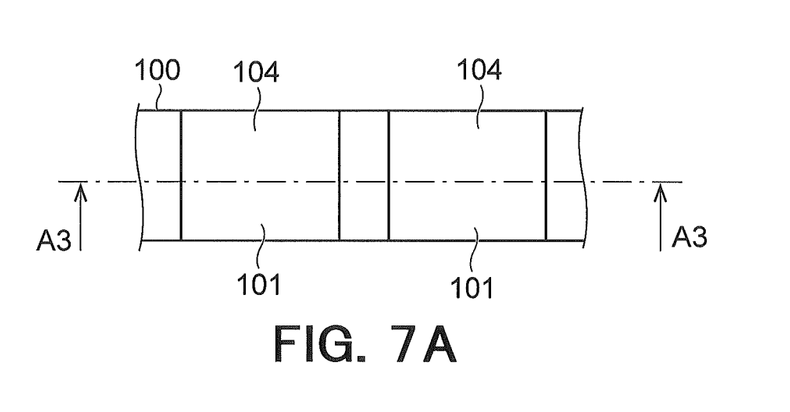
FIG. 7A is a plan view of the semiconductor device before etching conductive layers.
Figure 7B:
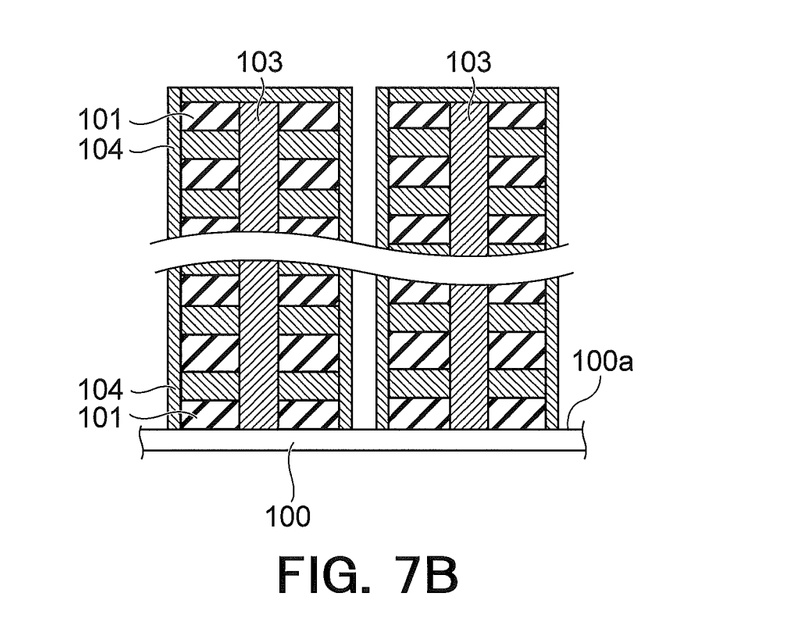
FIG. 7B is a cross sectional view taken along the sectional line A3-A3 shown in FIG. 7A.
Figure 8A:
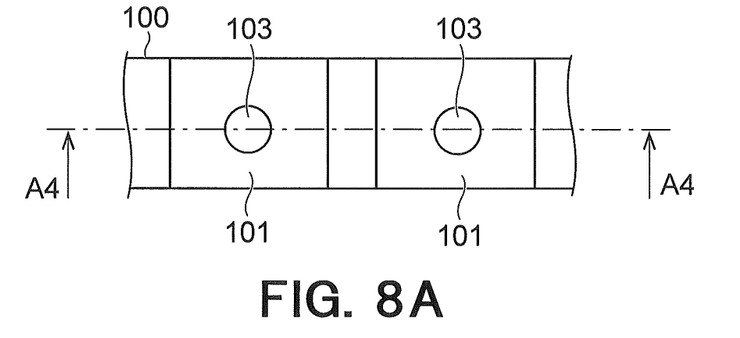
FIG. 8A is a plan view of the semiconductor device after etching parts of the conductive layers.
Figure 8B:
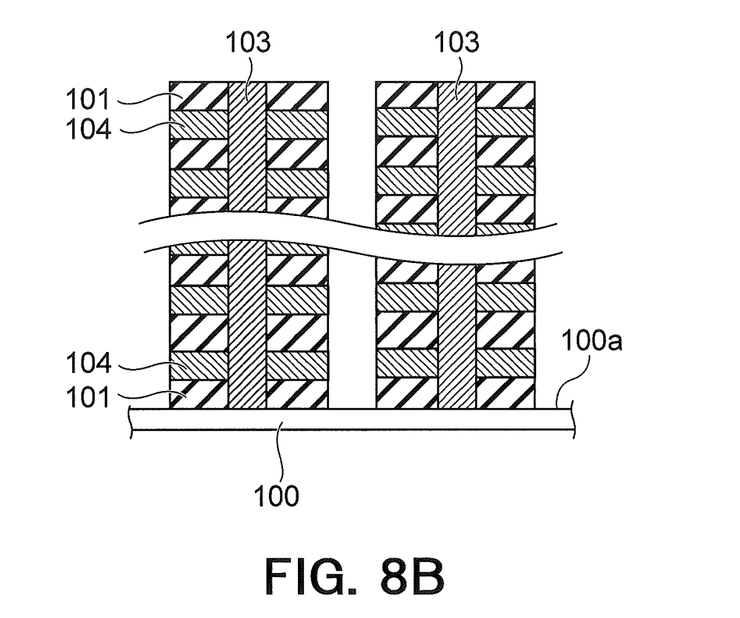
FIG. 8B is a cross sectional view taken along the sectional line A4-A4 shown in FIG. 8A.

FIG. 7A is a plan view of a semiconductor device before etching conductive layers. FIG. 7B is a cross sectional view taken along the sectional line A3-A3 shown in FIG. 7A. FIG. 8A is a plan view of the semiconductor device after etching parts of the conductive layers. FIG. 8B is a cross sectional view taken along the sectional line A4-A4 shown in FIG. 8A.

As shown in FIG. 7A and FIG. 7B, conductive layers 104 are formed on etching portions of the sacrificial layers 102 and surfaces of the insulating layers 101, for example, by CVD (Chemical Vapor Deposition) or ALD (Atomic Layer Deposition).

Subsequently, when the nozzle 20 ejects the liquid chemical 200 that is the etching liquid for the sacrificial layers 102, parts of the sacrificial layers 102 are etched as shown in FIG. 8A and FIG. 8B. The conductive layers 104 remaining after this step function as word lines.

Figure 9:
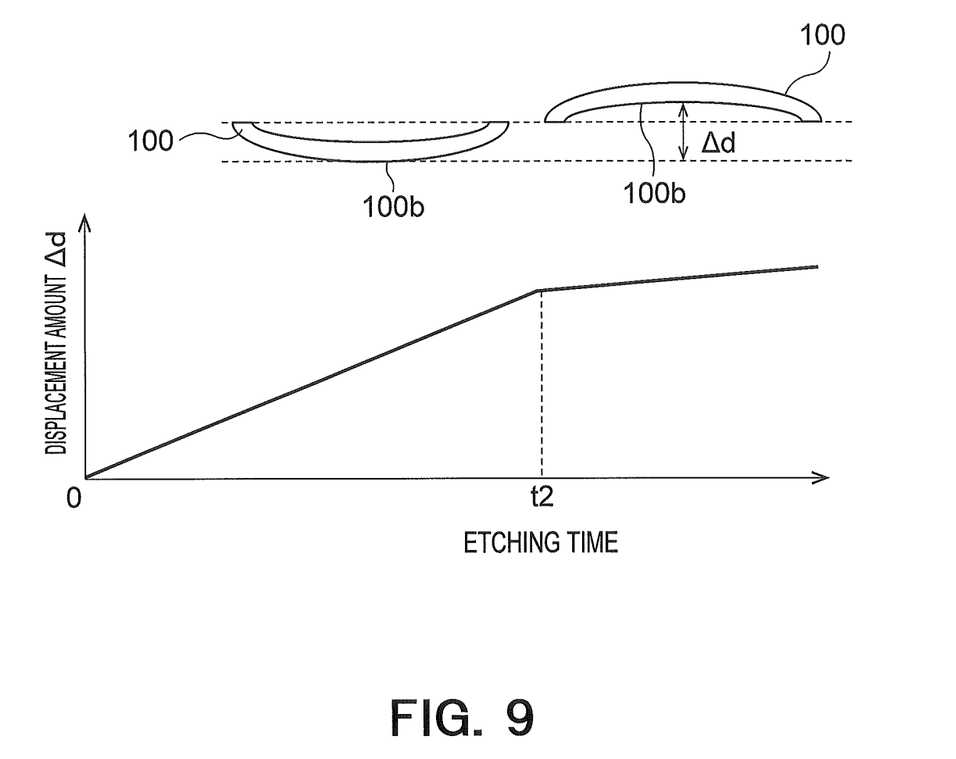
FIG. 9 is a diagram for explaining the displacement amount Δd of the semiconductor substrate in etching of the conductive layers.

FIG. 9 is a diagram for explaining the displacement amount $\Delta d$ of the semiconductor substrate 100 in etching of the conductive layers 104. As shown in FIG. 9, as etching of conductive layers 104 progresses, the displacement amount $\Delta d$ of the semiconductor substrate 100 continuously changes. After that, the warping of the semiconductor substrate 100 changes from being convex downward to being convex upward at timing t2 when the etching of the conductive layers 104 is brought into a state shown in FIG. 8B. The displacement amount $\Delta d$ also changes accordingly. The controller 40 causes the nozzle 20 to end the ejection of the liquid chemical 200, at timing t2 when the displacement amount $\Delta d$ changes.

According to the present embodiment described above, the optical measurer 30 radiates light toward the second surface 100b, of the semiconductor substrate 100, that is not an etching target to measure the displacement amount $\Delta d$ of the semiconductor substrate 100. Therefore, the state of progress of etching can be measured with high accuracy because of no influence of diffused reflection due to the liquid chemical 200.

Moreover, since in the present embodiment, measurement results of the optical measurer 30 are provided to the controller 40, the controller 40 can also detect the end point of etching and/or stop etching in the middle.

(Modification)

Hereafter, a modification of the first embodiment is described. Description of the matters similar to those of the first embodiment is omitted.

Figure 10A:
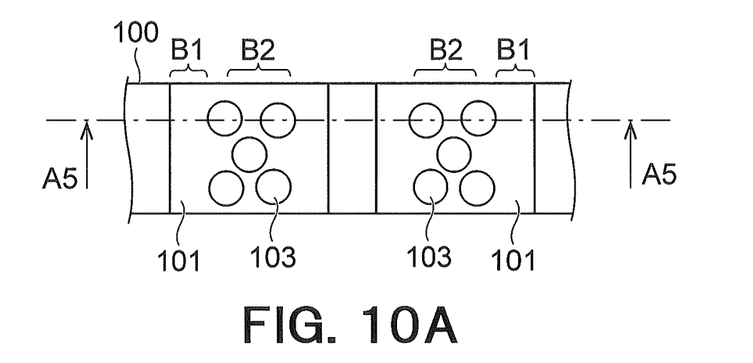
FIG. 10A is a plan view of the semiconductor device before etching sacrificial layers.
Figure 10B:
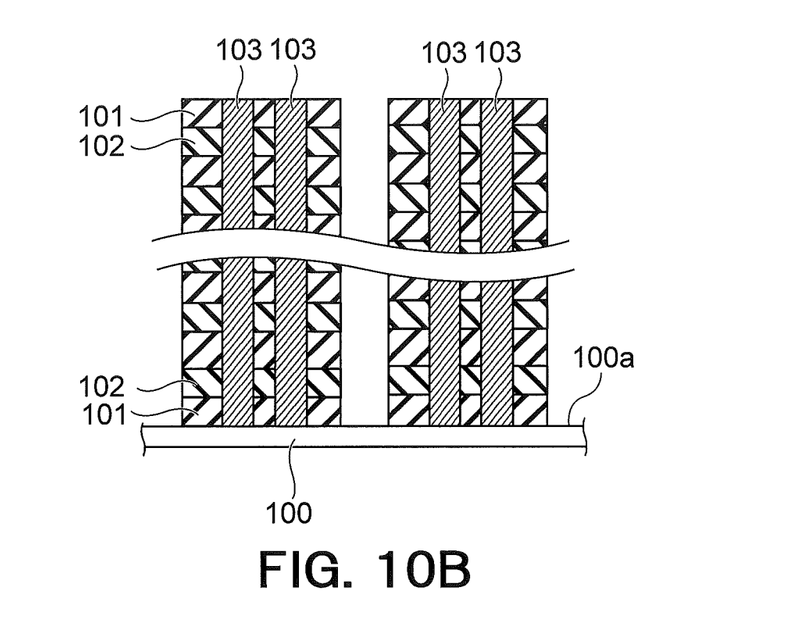
FIG. 10B is a cross sectional view taken along the sectional line A5-A5 shown in FIG. 10A.
Figure 11A:
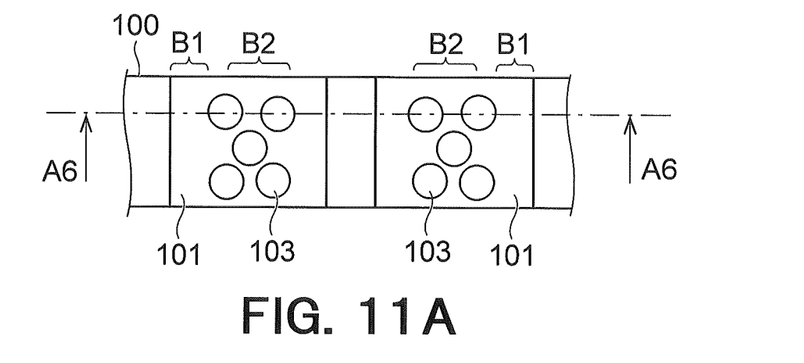
FIG. 11A is a plan view showing an interim result of etching of the sacrificial layers.
Figure 11B:
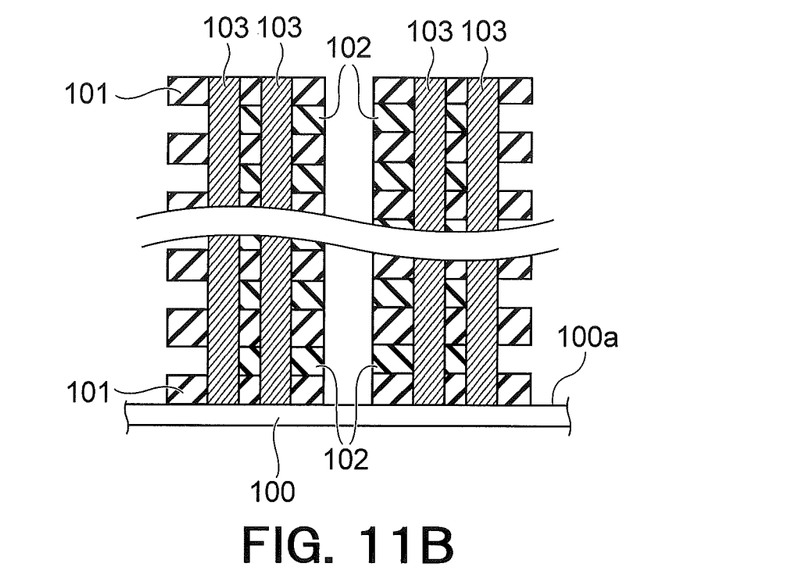
FIG. 11B is a cross sectional view taken along the sectional line A6-A6 shown in FIG. 11A.
Figure 12:
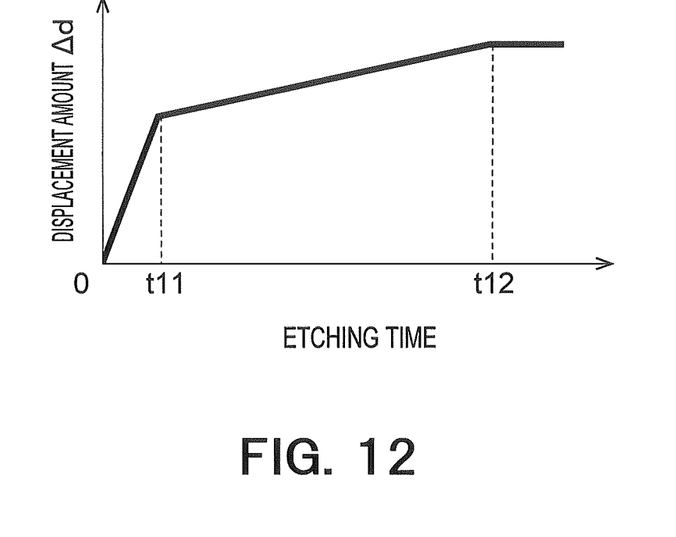
FIG. 12 is a graph showing relation between the etching time of the sacrificial layers and the displacement amount Δd of the semiconductor substrate.

FIG. 10A is a plan view of a semiconductor device before etching the sacrificial layers 102. FIG. 10B is a cross sectional view taken along the sectional line A5-A5 shown in FIG. 10A. FIG. 11A is a plan view showing an interim result of etching of the sacrificial layers 102. FIG. 11B is a cross sectional view taken along the sectional line A6-A6 shown in FIG. 11A. FIG. 12 is a graph showing relation between the etching time of the sacrificial layers 102 and the displacement amount $\Delta d$ of the semiconductor substrate 100.

As shown in FIG. 10A and FIG. 10B, in the present modification, each stacked body in which the insulating layers 101 and the sacrificial layers 102 are stacked has a region B1 in which columnar bodies 103 are not formed, and a region B2 in which a plurality of columnar bodies 103 aggregate.

Also in the present modification, the sacrificial layers 102 are etched using the semiconductor manufacturing apparatus 1 described in the first embodiment. In the present modification, as shown in FIG. 11A and FIG. 11B, first, the sacrificial layers 102 in the region B1 are etched. In this step, as shown in FIG. 12, the displacement amount $\Delta d$ of the semiconductor substrate 100 continuously increases within an etching time from 0 to timing t11.

After the sacrificial layers 102 in the region B1 are etched, the sacrificial layers 102 in the region B2 are etched. In this step, as shown in FIG. 12, the displacement amount Δd of the semiconductor substrate 100 changes from that during etching the sacrificial layers 102 in the region B1, within an etching time from timing t11 to timing t12. Therefore, in the present modification, when detecting change in displacement amount Δd, the controller 40 changes an etching condition for the sacrificial layers 102 based on the measurement result of the optical measurer 30.

For example, the controller 40 changes the type of the liquid chemical 200 ejected from the nozzle 20 (including pure water) or the supply amount thereof. Otherwise, the controller 40 may change the rotational speed of the stage 10. Thereby, there can be set in the region B1 a selection ratio of silicon nitride contained in the sacrificial layers 102 relative to silicon oxide contained in the insulating layers 101 to be low, and conversely in the region B2, the selection ratio can be set to be high, for example.

According to the present modification described above, an etching condition can be optimized in accordance with the shape of an etching region.

Second Embodiment

Figure 13:
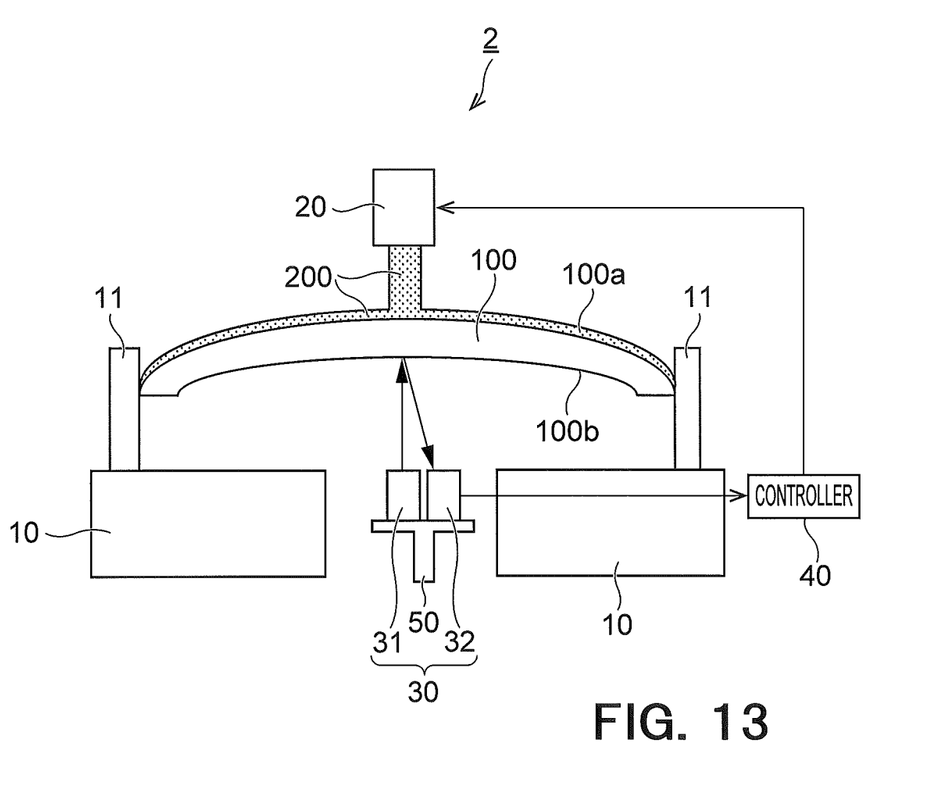
FIG. 13 is a schematic diagram showing an outline configuration of a semiconductor manufacturing apparatus according to a second embodiment.
Figure 14:
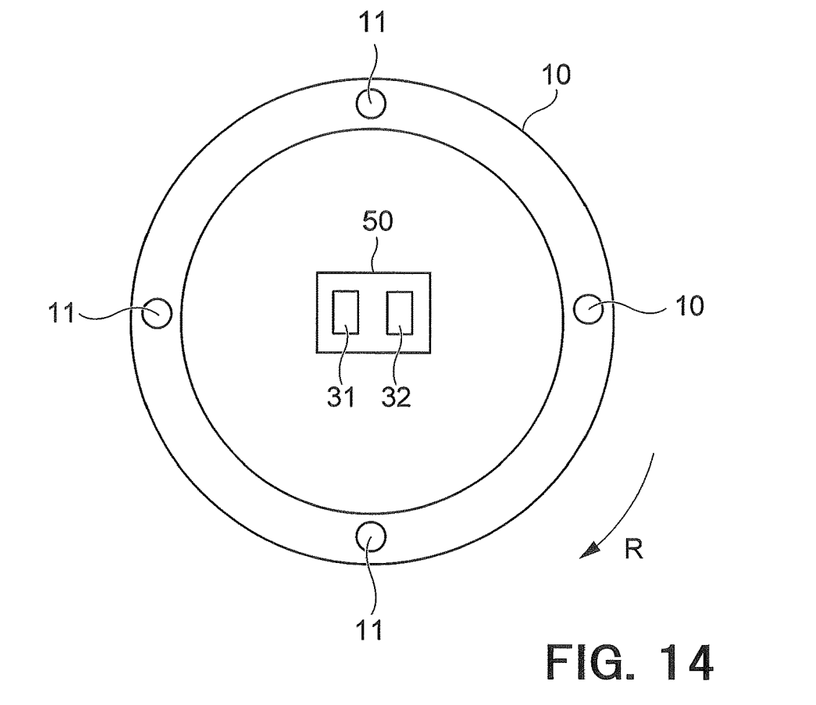
FIG. 14 is a plan view of a stage.

FIG. 13 is a schematic diagram showing an outline configuration of a semiconductor manufacturing apparatus according to a second embodiment. FIG. 14 is a plan view of the stage 10. In FIG. 13 and FIG. 14, the components similar to those of the aforementioned semiconductor manufacturing apparatus 1 according to the first embodiment are given the same signs and their detailed description is omitted.

As shown in FIG. 13 and FIG. 14, in a semiconductor manufacturing apparatus 2 according to the present embodiment, the shape of the stage 10 is an annular shape. Moreover, a supporting table 50 supports the optical measurer 30 in an opening part of the stage 10.

In the aforementioned first embodiment, the optical measurer 30 is integrated with the stage 10. Therefore, the optical measurer 30 possibly vibrates due to the rotation of the stage 10. There is hence concern that the influence of this vibration causes a position to which the light irradiator 31 radiates the light to vary and the measurements to be unstable.

Meanwhile, in the present embodiment, the optical measurer 30 is fixed to the supporting table 50 independently of the stage 10. Therefore, the optical measurer 30 is not affected by the vibration arising due to the rotation of the stage 10. Therefore, stable measurements are possible.

Third Embodiment

Figure 15:
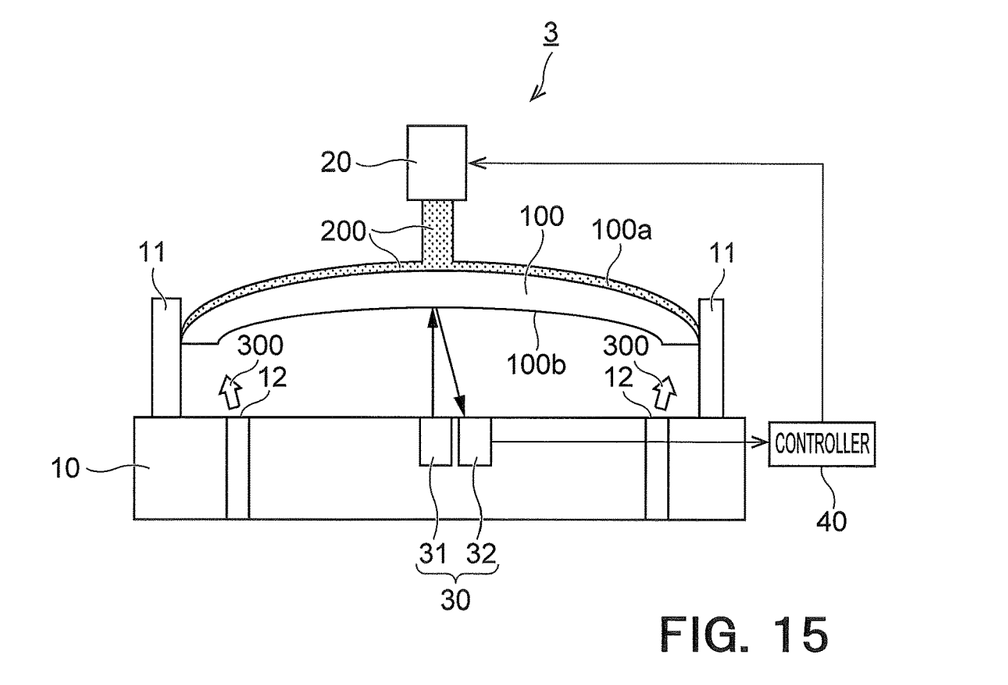
FIG. 15 is a schematic diagram showing an outline configuration of a semiconductor manufacturing apparatus according to a third embodiment.

FIG. 15 is a schematic diagram showing an outline configuration of a semiconductor manufacturing apparatus according to a third embodiment. In FIG. 15, the components similar to those of the aforementioned semiconductor manufacturing apparatus 1 according to the first embodiment are given the same signs and their detailed description is omitted.

As shown in FIG. 15, in a semiconductor manufacturing apparatus 3 according to the present embodiment, vents 12 are provided in the stage 10. The vents 12 emit inert gas 300 from the stage 10 side toward the outer circumferential part of the semiconductor substrate 100. The inert gas 300 is exemplarily nitrogen gas and is supplied to the stage 10 from the outside of the apparatus.

In the aforementioned first embodiment, the semiconductor substrate 100 is rotated along with the stage 10 during the nozzle 20 ejecting the liquid chemical 200. There is therefore a possibility that the liquid chemical 200 goes onto the second surface 100b from the first surface 100a around via the outer circumferential part. In such a case, there is concern that light radiated toward the second surface 100b from the light irradiator 31 scatters.

Meanwhile, in the present embodiment, the inert gas 300 is emitted toward the outer circumferential part of the semiconductor substrate 100 from the vents 12. The liquid chemical 200 can be thereby prevented from going around onto the second surface 100b. Therefore, highly accurate measurements by the optical measurer 30 can be secured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a stage to have a plurality of pins to hold a semiconductor substrate having a first surface on which a film to be etched is formed and a second surface positioned on an opposite side to the first surface;
   a nozzle to eject a liquid chemical toward the first surface of the semiconductor substrate from above the stage; and
   an optical measurer to radiate light toward the second surface of the semiconductor substrate from a side of the stage during ejection of the liquid chemical, and to measure a displacement amount of the semiconductor substrate based on a state of reception of light reflected on the second surface, and wherein the optical measurer is arranged on an opposite side of the nozzle across the semiconductor substrate, and the optical measurer is embedded in the stage.

2. The semiconductor manufacturing apparatus according to claim 1, further comprising a controller to control the nozzle based on a measurement result of the optical measurer.

3. The semiconductor manufacturing apparatus according to claim 2, wherein the controller changes an etching condition for the film based on the measurement result of the optical measurer.

4. The semiconductor manufacturing apparatus according to claim 1, wherein the stage has a vent to emit inert gas toward an outer circumferential part of the semiconductor substrate.

* * * * *